United States Patent [19]
Rutledge et al.

[11] Patent Number: 5,860,585
[45] Date of Patent: Jan. 19, 1999

[54] SUBSTRATE FOR TRANSFERRING BUMPS AND METHOD OF USE

[75] Inventors: James L. Rutledge, Austin, Tex.; Kenneth Kaskoun; James Jen-Ho Wang, both of Berlin, Germany

[73] Assignee: Motorola, Inc., Schaumburg, Ill.

[21] Appl. No.: 658,907

[22] Filed: May 31, 1996

[51] Int. Cl.⁶ .................................................. H01L 21/60
[52] U.S. Cl. ............................ 228/254; 438/616; 427/96
[58] Field of Search ................................... 228/253, 254, 228/180.22; 427/123, 96; 438/612–616

[56] References Cited

U.S. PATENT DOCUMENTS

| | | | |
|---|---|---|---|
| 3,516,155 | 6/1970 | Smith | 228/254 |
| 3,719,981 | 3/1973 | Steitz | 228/254 |
| 4,396,140 | 8/1983 | Jaffe et al. | 228/253 |
| 4,832,255 | 5/1989 | Bickford et al. | 228/41 |
| 5,217,597 | 6/1993 | Moore et al. . | |
| 5,237,269 | 8/1993 | Aimi et al. . | |
| 5,374,893 | 12/1994 | Koopman et al. . | |
| 5,381,946 | 1/1995 | Koopman et al. . | |
| 5,425,493 | 6/1995 | Interrante et al. | 228/254 |
| 5,440,239 | 8/1995 | Zappella et al. . | |
| 5,447,264 | 9/1995 | Koopman et al. . | |
| 5,616,206 | 4/1997 | Sakatsu et al. | 228/254 |

FOREIGN PATENT DOCUMENTS

| | | |
|---|---|---|
| 1996009 | 1/1996 | Germany . |
| 9304375 | 3/1993 | WIPO . |

*Primary Examiner*—Samuel M. Heinrich
*Attorney, Agent, or Firm*—Kenneth M. Seddon; Daniel R. Collopy

[57] ABSTRACT

A first pattern of bumps and a second pattern of bumps are formed on a substrate (10) with bumps (14,15). During a transfer process, only the bumps (14) of the first pattern of bumps are transferred to pad extensions (20) of a device (17). The bumps (15) of the second pattern of bumps are not affected by this process and can be later transferred to a second device.

14 Claims, 2 Drawing Sheets

SUBSTRATE FOR TRANSFERRING BUMPS AND METHOD OF USE

BACKGROUND OF THE INVENTION

This invention relates, in general, to electronic devices, and more particularly to transferring bumps to form an electronic device.

Some electronic devices require a physical and electrical bond between two components as is commonly done using flip-chip techniques. Traditional flip-chip techniques form a bump on each of the bonding pads of an integrated circuit and then mates each bump with the contacts of a plastic package or other device. The bumps are generally formed on the bonding pads using an electroplating process. This requires that a plating layer or conductive layer must be formed over the integrated circuit to attract conductive material in order to form the bumps. After the bumps are formed, the plating layer is removed using a wet etch solution or a reactive ion etch (RIE). The process steps required to form the bumps increase the manufacturing cost of the electronic device and introduce yield limiting problems such as particle defects.

By now it should be appreciated that it would be advantageous to provide a method for forming bumps on an electronic device, such as an integrated circuit, that did not require the formation of a plating layer on the electronic device.

DETAILED DESCRIPTION OF THE DRAWINGS

In general, the present invention provides a substrate that is used to transfer a pattern of bumps to a device such as an integrated circuit. The efficiency of the transfer process is improved by arranging the bumps on the substrate so that the different patterns of bumps for separate devices overlap one another. This will increase the total number of devices that can receive bumps from each substrate, which will in turn reduce the cost of the bump transfer process.

Figure 1:
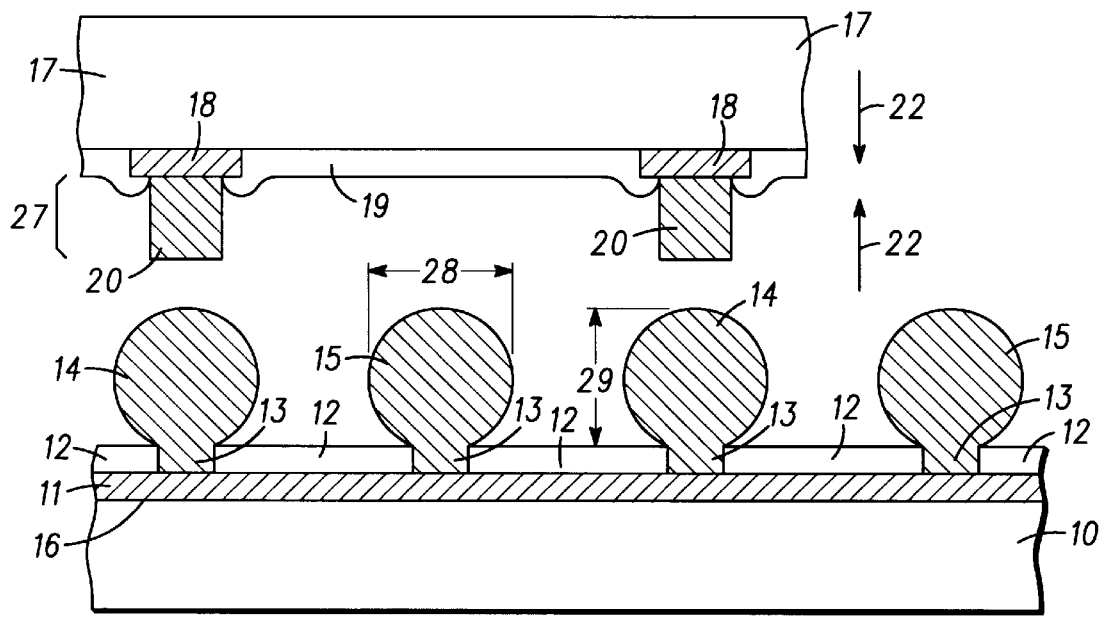
FIG. 1 is an enlarged cross-sectional view of a substrate used to transfer bumps to a device in accordance with the present invention.

Turning now to FIG. 1, a more detailed description of the present invention is provided. FIG. 1 is an enlarged cross-sectional view of a portion of a substrate 10 that is used to transfer bumps 14 and 15 to device 17. In the preferred embodiment, device 17 is an integrated circuit (IC). However, the present invention can be used to transfer bumps to a variety of materials for many applications. For example, device 17 can be a silicon substrate, a gallium arsenide substrate, a semiconductor device, a glass substrate, a magnetic material, a ceramic package, a pin grid array package, a semiconductor die, or other material used in the electronics industry.

In the preferred embodiment, substrate 10 has a plating layer 11 that is formed on a surface 16 of substrate 10. Plating layer 11 is used to form bumps 14 and 15 and can comprise a variety of materials depending on the technique used to form bumps 14 and 15. For example, plating layer 11 can be a layer of titanium tungsten, copper, aluminum, aluminum alloy, an adhesive material, or the like. An insulating layer 12 such as silicon dioxide or silicon nitride is formed on plating layer 11 with openings 13 to provide exposed portions of plating layer 11. Openings 13 are used to determine the location on substrate 10 where bumps 14 and 15 will be formed. Techniques known in the art, such as electroplating, are used to form bumps 14 and 15 on substrate 10. Bumps 14 and 15 preferably are formed from a tin-lead compound with a tin concentration of about 10 percent to 75 percent by weight.

Each of bumps 14 and 15 has a height 29 above insulating layer 12 of, for example, about 15 microns to 200 microns and a width of about 15 microns to 200 microns. It should also be understood that there are other methods of forming bumps 14 and 15 on substrate 10 that would not require the use of plating layer 11 or insulating layer 12. For example, bumps 14 and 15 could be formed with an electroless process, or by patterning an adhesive material on surface 16 of substrate 10 and immersing substrate 10 into a collection of bumps. The bumps would then only stick to substrate 10 where the adhesive material was patterned. Bumps 24 and 25 could also be formed by a screen printing process, a squeegee printing process, a solder jet process, or the like.

Bumps 14 provide a first pattern of bumps with each of bumps 14 corresponding to one of the pad extensions 20 of device 17. Bumps 15 provide a second pattern of bumps that is transferred to another device (not shown) as will be explained in more detail shortly.

Pad extensions 20 are preferably formed on bonding pads 18 of device 17 such that they are the only portions of device 17 that contact bumps 14. Pad extensions 20 have a height 27 of about 5 to 20 microns so that no portion of device 17 contacts any of bumps 15 overlapped by device 17, and so bumps 14 wet only to pad extensions 20. Height 27 is preferably great enough so that bumps 15 do not come in contact with any portion of device 17 due to any irregularities in the height 27 of bumps 15 or the planarity of device 17. Device 17 can further comprise a passivation layer 19 to protect the covered portions of device 17 from coming in contact with any of bumps 14 or 15. Passivation layer 19 can be a patterned layer of silicon dioxide or silicon nitride.

Figure 2:
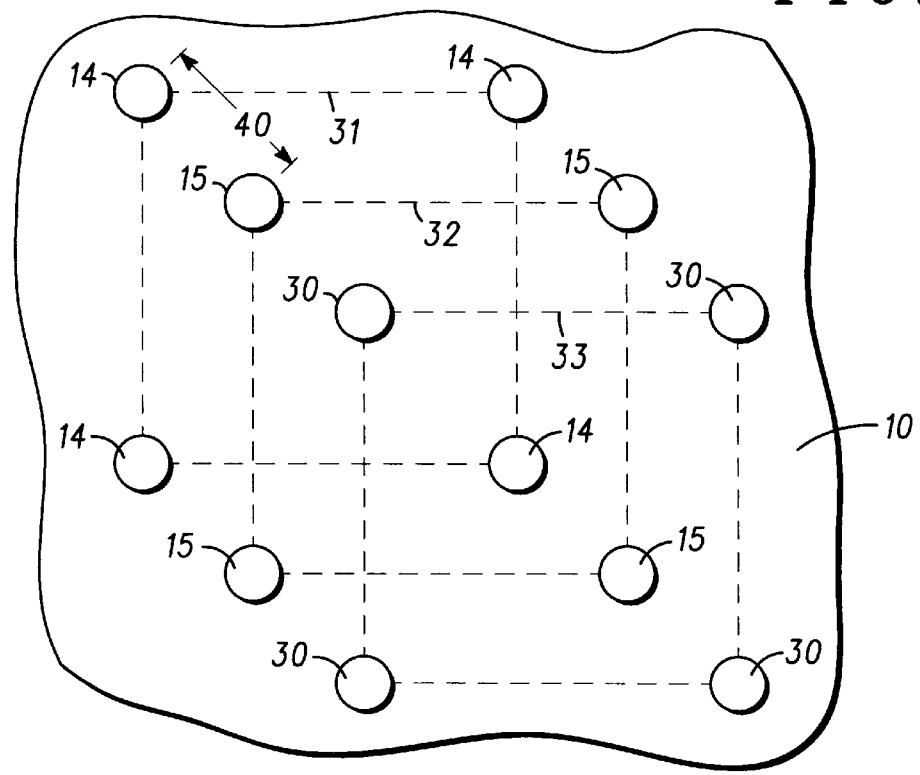
FIG. 2 is a plane view of the substrate in accordance with the present invention.

Turning now to FIG. 2, a more detailed explanation of the arrangement of the patterns of bumps on substrate 10 in accordance with the present invention is provided. A first dashed box 31 is used to define an area on substrate 10 that represents the four bumps 14 of the first pattern of bumps. A second dashed box 32 is used to define an area on substrate 10 that represents the four bumps 15 of the second pattern of bumps. The second set of bumps is offset from the first set of bumps by a distance 40 as shown in FIG. 2. Distance 40 is about 15 microns to 10,000 microns. It should also be understood that any number of bumps can be placed in each pattern of bumps and that one pattern of bumps may have more bumps than another on the same substrate.

As shown in FIG. 2, a portion of the area defined by the first pattern of bumps is overlapped by or intersects the area of the second pattern of bumps on the same substrate. So that the packing efficiency of bumps 14 and 15 on substrate 10 is improved. This will in turn reduce the cost of transferring each bump in a large scale manufacturing process. It should also be understood that the area or dimensions of one pattern of bumps need not be exactly the same for all patterns of bumps on a substrate. Thus, a variety of patterns of bumps could be formed on substrate 10 that correspond to different devices having different configurations of bonding pads.

As mentioned earlier, it is possible to form a plurality of patterns of bumps on substrate 10. A third pattern of bumps is also shown in FIG. 2 as a dashed box 33 defining the area of four bumps 30. The third pattern of bumps is not shown in FIG. 1. Increasing the density of bumps formed on substrate 10 optimizes the use of the surface area of substrate 10 and reduces the cost of forming device 17. In addition, substrate 10 of the present invention can be reused to form additional bumps to further distribute the cost of transferring bumps to a device.

Figure 3:
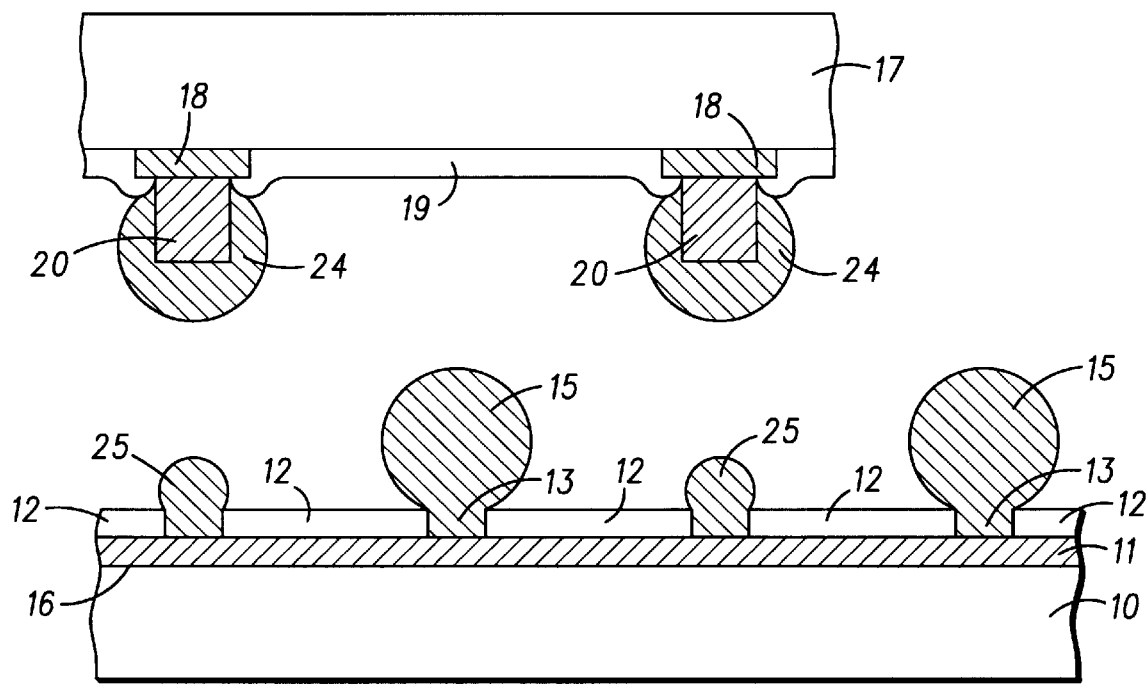
FIG. 3 is an enlarged cross-sectional view of the substrate after the transfer is complete in accordance with the present invention.

Referring back now to FIG. 1, a method for transferring bumps 14 to device 17 is now provided. To begin, device 17 is placed so that pad extensions 20 are aligned to the corresponding bump 14 of the first pattern of bumps. Pad extensions 20 are then moved in contact with bumps 14 as indicated by arrows 22. Once in contact, bumps 14 are heated to their melting temperature of about 150° C. to 220° C. so that the material of bumps 14 wets around pad extensions 20. Bumps 14 can also be heated prior to coming in contact with pad extensions 20. Device 17 is then moved away from substrate 10 so that bumps 24 are formed around pad extensions 20 as shown in FIG. 3.

One alternate method of forming bumps 24 includes the steps of cooling bumps 14 after they have formed around pad extensions 20 and then applying a mechanical stress such as shearing to form bumps 24. In addition, a tacking pressure of about 1 gram to 20 grams per bump may be applied to further assist in the transfer process. As bumps 24 are formed, a portion of the original bump 14 may remain on substrate 10. The remains are shown in FIG. 3 as a bump 25. Bumps 15 of the second pattern of bumps are unaffected by the process used to transfer the first pattern of bumps to device 17.

The above mentioned process can then be repeated to transfer the second pattern of bumps (bumps 15) to a second device (not shown). This process can be repeated over and over again as a plurality of patterns of bumps can be formed on substrate 10. After all the bumps on substrate 10 have been transferred to various devices, the remaining material of bumps 25 can be removed and a new set of bumps can be formed so that substrate 10 can be reused repeatedly.

By now it should be appreciated that the present invention provides a substrate, and a method of using the same, that has improved efficiency over some previously known methods. The higher density of bumps maximizes the use of the surface are of a substrate and reduces the cost of transferring bump. In addition, the present invention obviates the need to form a plating layer on each device to further simply the manufacturing process and reduce the assembly cost of electronic devices.

We claim:

1. A method of forming a semiconductor device comprising the step of transferring a first pattern of bumps from a substrate to the semiconductor device, wherein the substrate has a second pattern of bumps and at least a portion of the second pattern of bumps is overlapped by the first pattern of bumps.

2. The method of claim 1 wherein the bumps have a tin concentration of about 10 percent to 75 percent by weight.

3. The method of claim 1 wherein the step of transferring the first pattern of bumps includes the step of shearing the first pattern of bumps off the substrate.

4. The method of claim 1 wherein first pattern of bumps is attached to the substrate with an adhesive material.

5. The method of claim 1 wherein the first pattern of bumps is offset from the second pattern of bumps by a distance of about 15 microns to 10,000 microns.

6. The method of claim 1 wherein the semiconductor device comprises an electronic device selected from the group consisting of an integrated circuit, a silicon substrate, a gallium arsenide substrate, a glass substrate, a magnetic material, a ceramic package, a pin grid array package, and a semiconductor die.

7. The method of claim 1 wherein the first pattern of bumps is formed by a screen printing process, a squeegee printing process, or a solder jet process.

8. A method of forming an electronic device by transferring bumps, wherein the method comprises the steps of:

providing a substrate that has a first pattern of bumps and a second pattern of bumps, wherein the first pattern of bumps overlaps the second pattern of bumps;

providing a first device that has a pattern of bonding pads, wherein each of the bonding pads corresponds to one of the bumps of the first pattern of bumps;

placing the first device such that the bonding pads of the first device are in contact with corresponding bumps of the first pattern of bumps;

transferring the first pattern of bumps to the bonding pads of the first device;

providing a second device that has a pattern of bonding pads, wherein each of the bonding pads corresponds to one of the bumps of the second pattern of bumps;

placing the second device such that the bonding pads of the second device are in contact with corresponding bumps of the second pattern of bumps; and transferring the second pattern of bumps to the bonding pads of the second device.

9. The method of claim 8 wherein the step of transferring the first pattern of bumps includes the step of heating the substrate so that the first pattern of bumps adheres to the bonding pads of the first device.

10. The method of claim 8 wherein the first device is a device selected from the group consisting of an integrated circuit, a silicon substrate, a gallium arsenide substrate, a glass substrate, a magnetic material, a ceramic package, a pin grid array package, and a semiconductor die.

11. The method of claim 8 wherein the substrate comprises a plating layer, overlying the substrate, and an insulating layer, overlying the plating layer, that has openings to provide exposed portions of the plating layer, and each of the bumps of the first pattern of bumps is overlying one of the exposed portions of the plating layer.

12. The method of claim 8 wherein the first pattern of bumps is offset from the second pattern of bumps by a distance of about 15 microns to 10,000 microns.

13. The method of claim 8 wherein the step of transferring the first pattern of bumps includes the step of applying a tacking pressure of about 1 gram to 20 grams per bump.

14. The method of claim 8 wherein the substrate has a surface and further comprises an adhesive material formed on the surface of the substrate, wherein the bumps of the first pattern of bumps are attached to the substrate by the adhesive material.

* * * * *